(12) United States Patent
Sakaue

(10) Patent No.: US 12,512,354 B2
(45) Date of Patent: Dec. 30, 2025

(54) SUBSTRATE PROCESSING APPARATUS AND SUBSTRATE PROCESSING METHOD

(71) Applicant: TOKYO ELECTRON LIMITED, Tokyo (JP)

(72) Inventor: Hiromitsu Sakaue, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 393 days.

(21) Appl. No.: 18/021,157

(22) PCT Filed: Aug. 12, 2021

(86) PCT No.: PCT/JP2021/029759
§ 371 (c)(1),
(2) Date: Feb. 13, 2023

(87) PCT Pub. No.: WO2022/044834
PCT Pub. Date: Mar. 3, 2022

(65) Prior Publication Data
US 2023/0317488 A1     Oct. 5, 2023

(30) Foreign Application Priority Data
Aug. 24, 2020   (JP) ................ 2020-141126

(51) Int. Cl.
*H01L 21/677*     (2006.01)
*H01L 21/687*     (2006.01)

(52) U.S. Cl.
CPC .. *H01L 21/67751* (2013.01); *H01L 21/68742* (2013.01); *H01L 21/68764* (2013.01); *H01L 21/68785* (2013.01)

(58) Field of Classification Search
None
See application file for complete search history.

(56) References Cited

U.S. PATENT DOCUMENTS 7,959,395 B2 * 6/2011 Hofmeister ....... H01L 21/67161
414/217
10,483,141 B2 * 11/2019 Janakiraman ..... H01L 21/67709
(Continued)

FOREIGN PATENT DOCUMENTS

JP     H7-117849 A     5/1995
JP     2018-504784 A   2/2018
(Continued)

OTHER PUBLICATIONS

PCT International Search Report and Written Opinion, PCT Application No. PCT/JP2021/029759, Sep. 14, 2021, 10 pages (with English translation of PCT International Search Report).

*Primary Examiner* — Michael S Lowe
(74) *Attorney, Agent, or Firm* — Fenwick & West LLP

(57) ABSTRACT

There is provided a substrate processing apparatus comprising: a substrate transfer chamber having a floor provided with a first magnet a substrate transfer module including a stage on which a substrate is placed, a traveling plate disposed below the stage, and a second magnet having a repulsive force with respect to the first magnet, the substrate transfer module being configured to be movable in the substrate transfer chamber by magnetic levitation using the repulsive force; and a substrate processing chamber disposed on an upper surface side of the substrate transfer chamber to process the substrate, the substrate processing chamber having an opening having a size that allows at least a part of the stage on which the substrate is placed to pass therethrough, the opening being open toward the inside of the substrate transfer chamber. The substrate is processed in a state where the stage on which the substrate is placed is inserted into the substrate processing chamber through the opening by raising the substrate transfer module and the opening is closed by the traveling plate.

17 Claims, 9 Drawing Sheets

(56) References Cited

U.S. PATENT DOCUMENTS

| | | | |
|---|---|---|---|
| 10,636,687 B2* | 4/2020 | Lau | C23C 14/50 |
| 2007/0009652 A1* | 1/2007 | Manz | C23C 14/20 |
| | | | 430/311 |

FOREIGN PATENT DOCUMENTS

| | | |
|---|---|---|
| KR | 10-2017-0106464 A | 9/2017 |
| WO | WO 2010/013333 A1 | 2/2010 |
| WO | WO 2016/118335 A1 | 7/2016 |
| WO | WO 2019/182952 A1 | 9/2019 |

* cited by examiner

SUBSTRATE PROCESSING APPARATUS AND SUBSTRATE PROCESSING METHOD

TECHNICAL FIELD

The present disclosure relates to a substrate processing apparatus and a substrate processing method.

BACKGROUND

For example, in an apparatus for performing processing a semiconductor wafer (hereinafter, also referred to as "wafer"), which is a substrate, the wafer is transferred between a carrier containing wafers and a wafer processing chamber where a processing is performed. Various types of wafer transfer mechanisms are used to transfer wafers.

For example, Patent Document 1 discloses a magnetic levitation transfer apparatus including a transfer table for transferring an object to be transferred such as a semiconductor wafer by levitating and travelling a transfer path while maintaining a non-contact state with respect to a track and a partition wall by the action of a magnetic force from a magnetic pole.

PRIOR ART DOCUMENTS

Patent Documents

Patent Document 1: Japanese Laid-open Patent Publication No. H7-117849

SUMMARY

Problems to Be Resolved by the Invention

The present disclosure provides a technique for transferring a substrate using magnetic levitation while suppressing an increase in the footprint of installed equipment.

Means for Solving the Problem

A substrate processing apparatus according to the present disclosure comprises:
a substrate transfer chamber having a floor provided with a first magnet; a substrate transfer module including a stage on which a substrate is placed, a traveling plate disposed below the stage, and a second magnet having a repulsive force with respect to the first magnet, and the substrate transfer module being configured to be movable in the substrate transfer chamber by magnetic levitation using the repulsive force; and
a substrate processing chamber disposed on an upper surface side of the substrate transfer chamber to process the substrate, the substrate processing chamber having an opening having a size that allows at least a part of the stage on which the substrate is placed to pass through, the opening being opened toward the inside of the substrate transfer chamber.

The substrate is processed in a state where the stage on which the substrate is placed is inserted into the substrate processing chamber through the opening by raising the substrate transfer module and the opening is closed by the traveling plate.

Effect of the Invention

In accordance with the present disclosure, a substrate can be transferred using magnetic levitation while suppressing an increase in the footprint of installed equipment.

DETAILED DESCRIPTION

An overall configuration of a wafer processing apparatus 100, which is an apparatus for processing a substrate according to the present embodiment, will be described below with reference to FIGS. 1 to 3.

Figure 1:
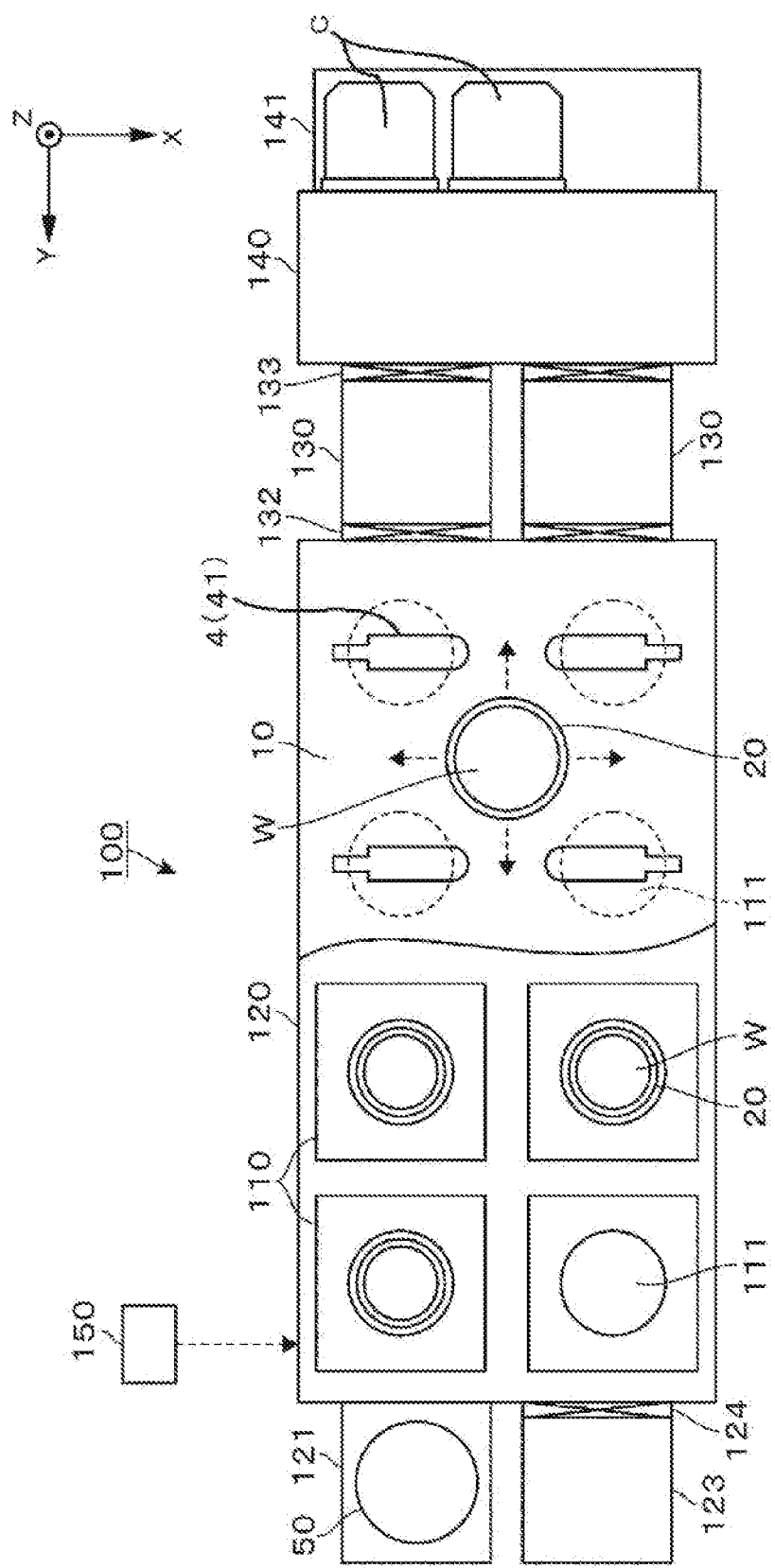
FIG. 1 a plan view of a wafer processing apparatus according to the present disclosure.
Figure 2:
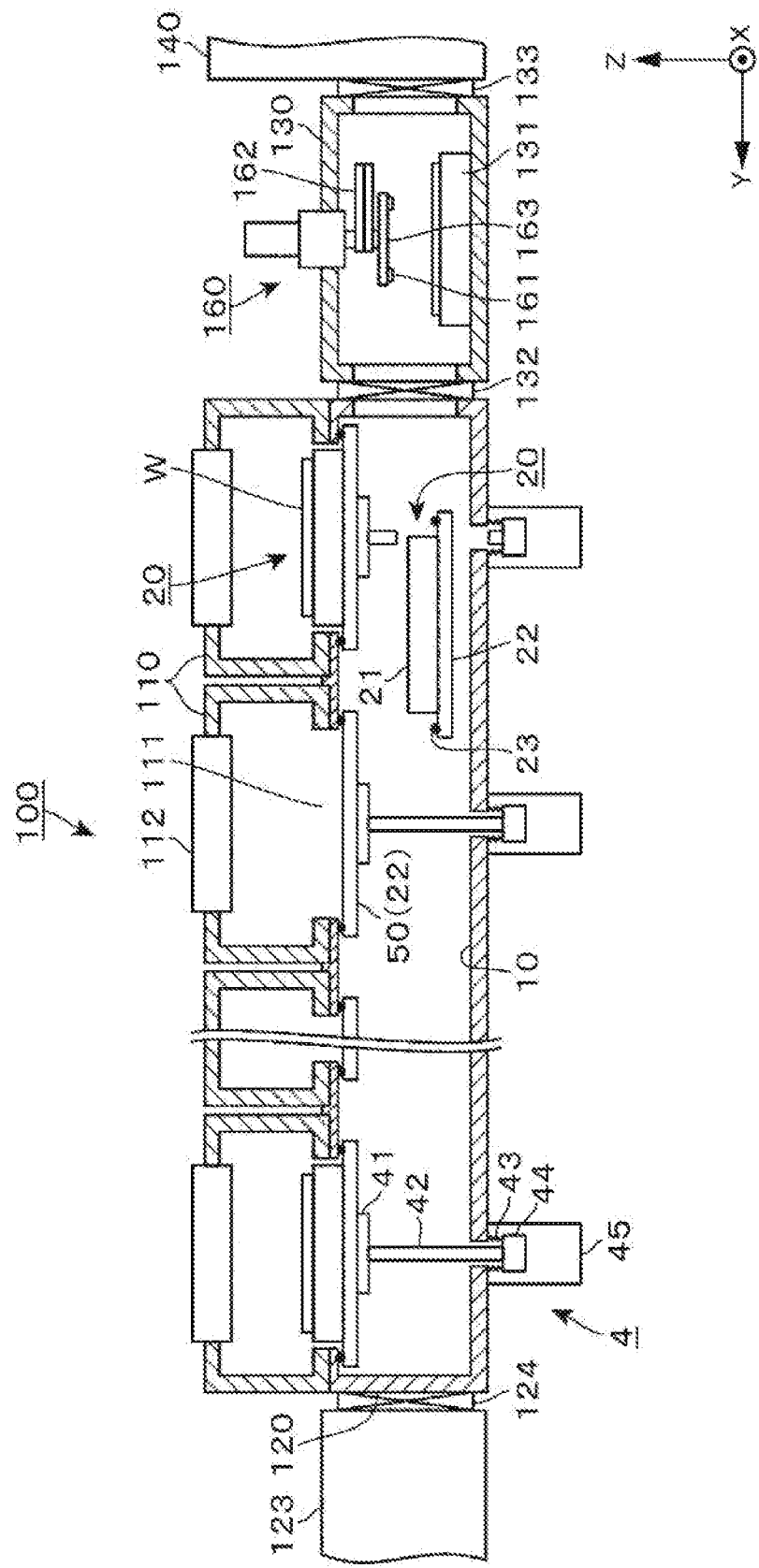
FIG. 2 a longitudinal side view of the wafer processing apparatus.
Figure 3:
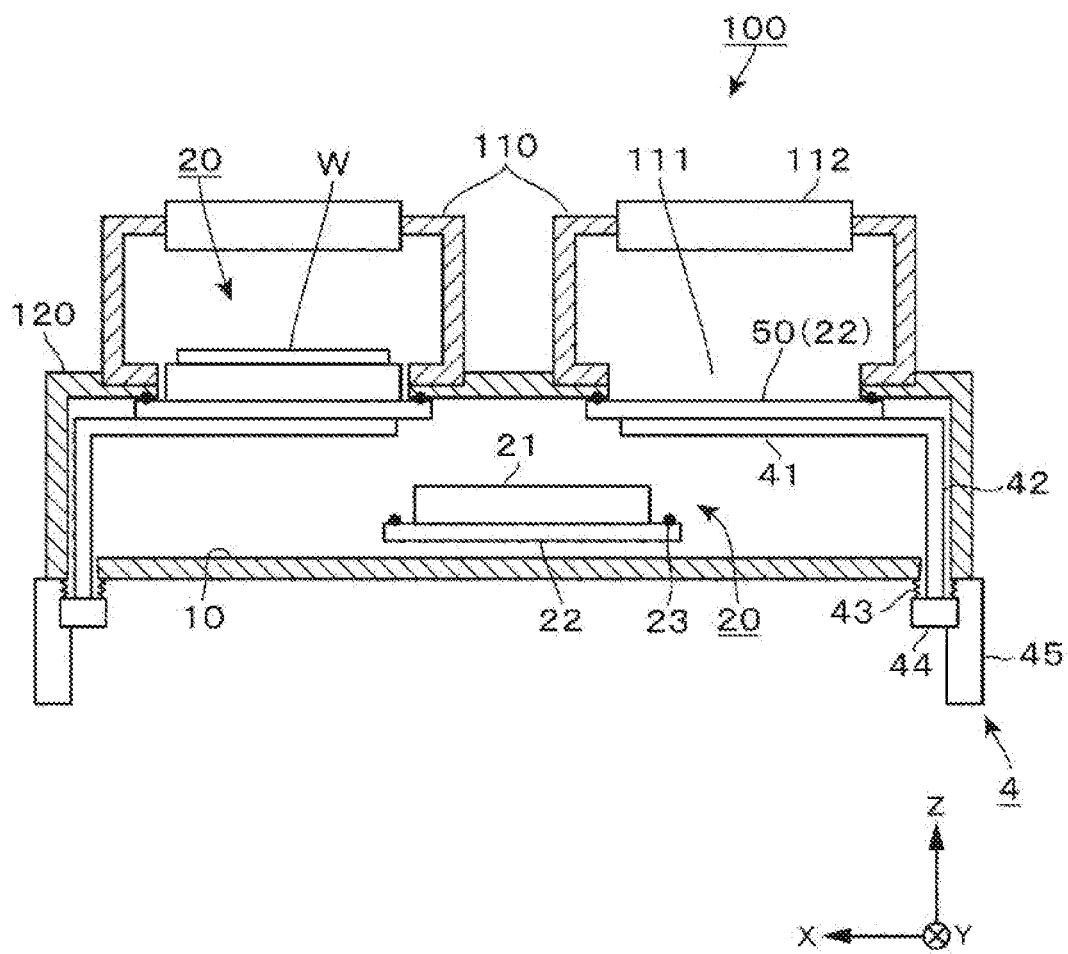
FIG. 3 a longitudinal front view of the wafer processing apparatus.

FIGS. 1 to 3 show a multi-chamber type wafer processing apparatus 100 including a plurality of wafer processing chambers 110, which are substrate processing chambers for processing wafers W. As shown in FIG. 1, the wafer processing apparatus 100 includes a load port 141, an atmospheric transfer chamber 140, load-lock chambers 130, a vacuum transfer chamber 120, and the plurality of wafer processing chambers 110. In the following description, a side on which the load port 141 is provided is a front side.

In the wafer processing apparatus 100, the load port 141, the atmospheric transfer chamber 140, the load-lock chambers 130, and the vacuum transfer chamber 120 are arranged in this order from the front side in a front-rear direction. The plurality of wafer processing chambers 110 are provided side by side on the upper surface side of the vacuum transfer chamber 120.

The load port 141 is configured as a placing table on which a carrier C containing the wafer W to be processed is placed. As the carrier C, for example, a front opening unified pod (FOUP) or the like can be used.

The atmospheric transfer chamber 140 has an atmospheric pressure atmosphere, and a down flow of clean air, for example, is formed in the atmospheric transfer chamber 140. A wafer transfer mechanism (not shown) for transferring the wafer W is provided inside the atmospheric transfer chamber 140. The wafer transfer mechanism in the atmospheric transfer chamber 140 transfers the wafer W between the carrier C and the load-lock chamber 130.

The load-lock chambers 130 are provided between the vacuum transfer chamber 120 and the atmospheric transfer chamber 140. The load-lock chamber 130 has a stage 131 on which the loaded wafer W is placed. The load-lock chamber 130 is configured to switch between an atmospheric pressure atmosphere and a vacuum atmosphere. The load-lock chambers 130 and the atmospheric transfer chamber 140 are connected via gate valves 133. Further, the load-lock chambers 130 and the vacuum transfer chamber 120 are connected via gate valves 132. Further, the load-lock chamber 130 is provided with a wafer transfer mechanism 160 for transferring the wafer W to and from the vacuum transfer chamber 120, and the configuration of which will be described later.

The vacuum transfer chamber 120 is evacuated to a vacuum atmosphere by a vacuum exhaust mechanism (not shown). A wafer transfer module 20 for transferring the wafer W between the stage 131 and each wafer processing chamber 110 is provided inside the vacuum transfer chamber 120. A detailed configuration of the wafer transfer module 20 will be described later. The vacuum transfer chamber 120 corresponds to a substrate transfer chamber of the present embodiment.

As shown in FIGS. 1 to 3, the vacuum transfer chamber 120 is configured by a housing that is elongated in the front-rear direction and has a rectangular shape in a plan view. In the wafer processing apparatus 100 of this example, a total of eight wafer processing chambers 110 are provided on the upper surface side of the vacuum transfer chamber 120. These wafer processing chambers 110 are divided into two rows on the left and right when viewed from the front side, and four chambers each are arranged side by side.

Each wafer processing chamber 110 is evacuated to a vacuum atmosphere by the vacuum exhaust mechanism (not shown), and a predetermined processing is performed on the wafer W therein. Examples of the processing to be performed on the wafer W include etching processing, film formation processing, cleaning processing, ashing processing, or the like. When the processing to be performed on the wafer W uses a processing gas, the wafer processing chamber 110 is provided with a processing gas supply 112 including a showerhead or the like (see FIGS. 2 and 3).

Further, at a position where each wafer processing chamber 110 is connected to the upper surface of the vacuum transfer chamber 120, a circular opening 111 that penetrates the ceiling of the vacuum transfer chamber 120 and communicates with the inner space of the vacuum transfer chamber 120 is provided. On the other hand, no gate valve or the like for opening and closing the opening 111 is provided between each wafer processing chamber 110 and the vacuum transfer chamber 120. The wafer processing chamber 110 corresponds to the substrate processing chamber of the present embodiment.

In the wafer processing apparatus 100 having the schematic configuration described above, the wafer transfer module 20 is configured to be movable within the vacuum transfer chamber 120 by magnetic levitation. Further, the wafer transfer module 20 not only transfers the wafer W, but also has a function of being connected to the wafer processing chamber 110 and supporting the wafer W loaded into the wafer processing chamber 110 during the processing of the wafer W.

In the following, the configuration of device related to the transfer of the wafer W using the wafer transfer module and the processing will be described in detail.

As shown in FIGS. 2 and 3, the wafer transfer module 20 includes a stage 21 on which the wafer W is placed, and a traveling plate 22 disposed below the stage 21.

For example, the stage 21 is formed in a shape of a flat disc, and its upper surface serves as a placing surface for placing the wafer W to be transferred and processed. The diameter of the stage 21 is smaller than that of the aforementioned opening 111 formed on the wafer processing chamber 110 side, and the stage 21 can be inserted into the wafer processing chamber 110 through the opening 111.

The diameter of the opening 111 may be larger than the diameter of the wafer W, and may be a dimension such that a portion of the stage 21 on which the wafer W is placed can be inserted into the opening 111.

Figure 6:
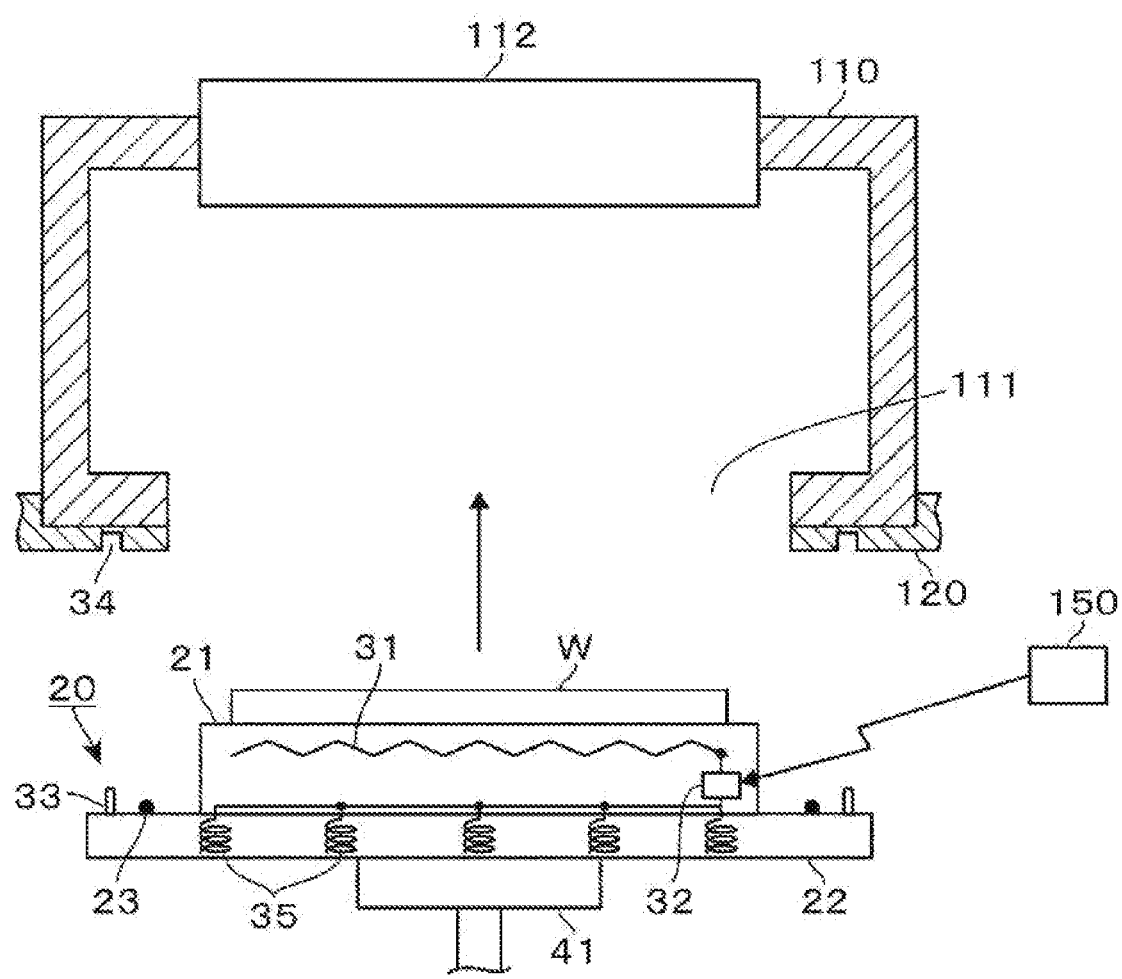
FIG. 6 a first action diagram relating to an operation of the wafer transfer module.

As shown in FIG. 6 or the like, inside the stage 21, a heater 31 may be provided to heat the wafer W placed on the stage 21 when processing is performed. Power is supplied to the heater 31 from a battery 32, which is a heating power supply provided in the wafer transfer module 20, so that the stage 21 generates heat.

For example, the battery 32 is controlled by a power supply controller (not shown) provided in the wafer transfer module 20 to increase/decrease and supply/stop the power supplied to the heater 31. The power supply controller may be configured to obtain a control signal related to the power supply control through wireless communication with a controller 150, which will be described later.

In the case where the wafer W is heated by providing a heating lamp or a light emitting diode (LED) on the wafer processing chamber 110 side, the heater 31 in the stage 21 may not be provided.

A disc-shaped traveling plate 22 is provided on the lower side of the stage 21, for example, so as to support the stage 21 from its lower surface side. The traveling plate 22 has a diameter larger than that of the stage 21 and can close the opening 111 of the wafer processing chamber 110.

An O-ring 23 is provided on the upper surface of the traveling plate 22 so as to surround the stage 21 (the opening 111 on the wafer processing chamber 110 side). The O-ring 23 keeps the inside of the wafer processing chamber 110 airtight in a state where the opening 111 is closed by the traveling plate 22.

As shown in the enlarged view of FIG. 6 or the like, positioning pins 33 may be provided on the upper surface of the traveling plate 22. In this case, after positioning the wafer transfer module 20 so that the positioning pins 33 are inserted into positioning holes 34 provided on the ceiling surface side of the vacuum transfer chamber 120, the stage 21 is inserted into the wafer processing chamber 110. By this positioning, the wafer W can be processed at a preset correct position.

It is not limited to an example in which the travelling plate 22 is configured by a plate-shaped member that supports the stage 21 from the lower surface side. For example, the traveling plate 22 may be configured by providing an annular member so as to extend like a flange from a side peripheral surface on a lower portion side of the stage 21.

Figure 4:
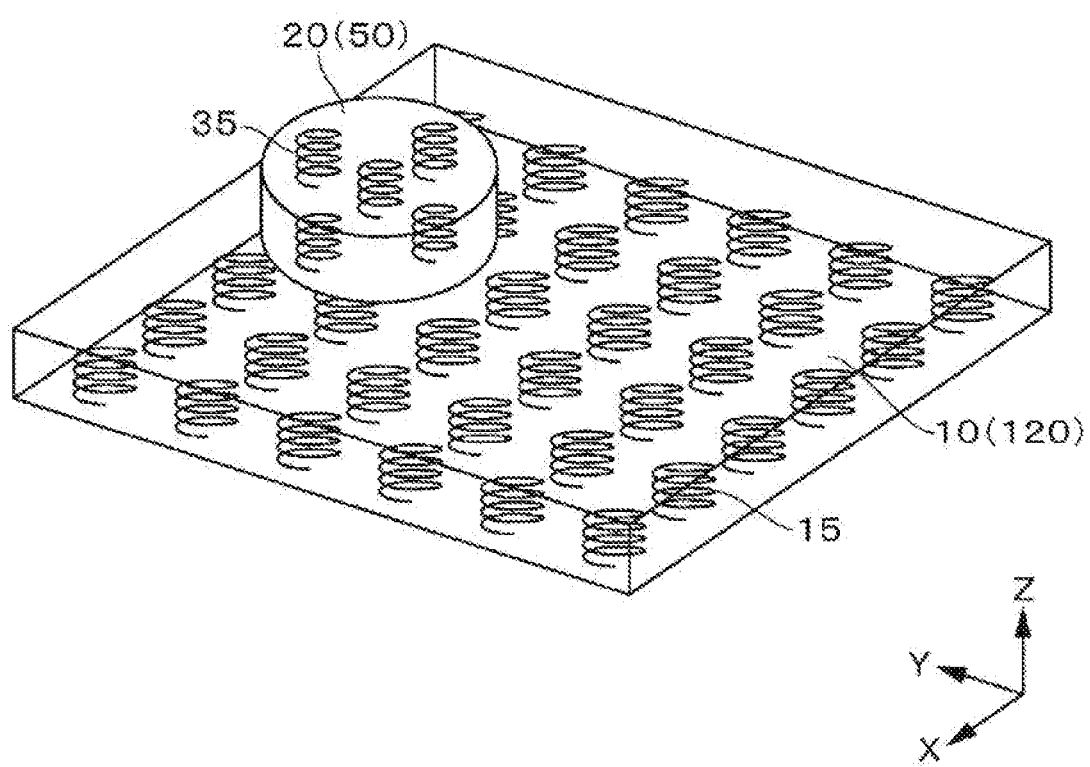
FIG. 4 a schematic diagram of a floor of a vacuum transfer chamber and a wafer transfer module.

As schematically shown in FIG. 4, a plurality of floor-side coils 15 are arranged in a floor 10 of the vacuum transfer chamber 120. The floor-side coil 15 generates a magnetic field when power is supplied from a power supply (not shown). From this point of view, the floor-side coil 15 corresponds to a first magnet of the present embodiment.

On the other hand, a plurality of module-side coils 35 are also arranged inside the wafer transfer module 20. A repulsive force acts between the module-side coil 35 and the magnetic field generated by the floor-side coil 15. By this action, the wafer transfer module 20 can be magnetically levitated with respect to the floor 10. Further, by adjusting the strength and position of the magnetic field generated by the floor-side coil 15, it is possible to move the wafer transfer module 20 in a desired direction on the floor 10, adjust the levitation amount, and adjust the orientation of the wafer transfer module 20. In addition to the plurality of module-side coils 35, a permanent magnet may be provided in the wafer transfer module 20 as an auxiliary.

Figure 7:
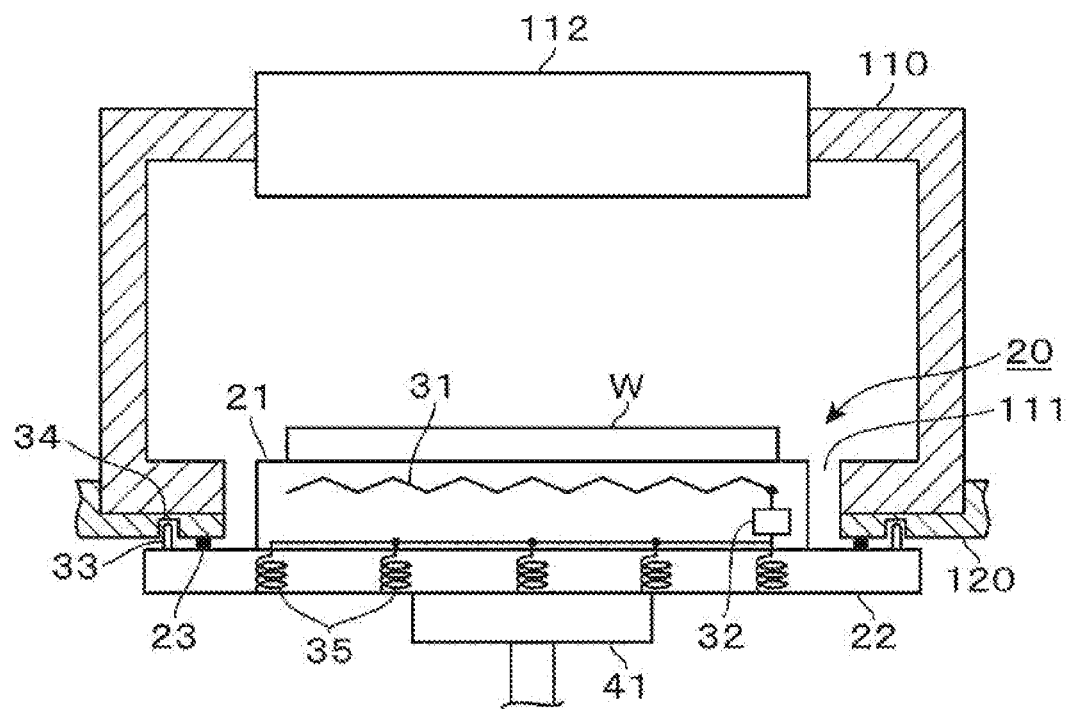
FIG. 7 a second action diagram relating to the operation of the wafer transfer module.

The module-side coil 35 provided in the wafer transfer module 20 corresponds to a second magnet of the present embodiment. The module-side coil 35 is supplied with power from the battery 32, which is a magnet power supply provided in the wafer transfer module 20, and functions as an electromagnet. For convenience of illustration, in FIGS. 6 and 7, the battery 32 that supplies power to the heater 31 is used to supply power to the module-side coil 35 as well. Different from this example, the heating power supply and the magnet power supply may be configured by different batteries 32.

Further, instead of the module-side coil 35, only a permanent magnet may be provided in the wafer transfer module 20 to constitute the second magnet.

For example, the power supply controller (not shown) provided in the wafer transfer module 20 controls to increase/decrease and supply/stop the power supplied to each module-side coil 35. At this time, the power supply controller may be configured to obtain a control signal related to the power supply control through wireless communication with the controller 150, which will be described later.

In the vacuum transfer chamber 120, a plurality of raising and lowering mechanisms 4, each for inserting the stage 21 into the wafer processing chamber 110 through the opening 111, are provided in association with each wafer processing chamber 110.

As shown in FIGS. 2 and 3, the raising and lowering mechanism 4 includes a support plate 41 for supporting the wafer transfer module 20 from its bottom surface side, a base 45 disposed on the lower surface side of the floor 10 and having a slider 44 moving up and down along a rail (not shown), and a strut 42 that supports the support plate 41 and is connected to the slider 44 while penetrating through the vacuum transfer chamber 120.

By moving the wafer transfer module 20 onto the support plate 41 and moving the slider 44 upward, the wafer transfer module 20 supported by the support plate 41 is raised toward the wafer processing chamber 110 side.

Further, a stretchable bellows 43 is provided between the lower surface of the floor 10 and the upper surface of the slider 44 so as to surround the strut 42 penetrating through the floor 10. The bellows 43 prevents gas from entering from the outside atmosphere and keeps the inside of the vacuum transfer chamber 120 airtight.

Here, as shown in FIGS. 2 and 3, the inner space of the vacuum transfer chamber 120 is configured to have a height dimension that allows another wafer transfer module 20 to move below the support plate 41 in a state where the support plate is raised and the stage 21 is inserted into the wafer processing chamber 110.

Further, as shown in FIGS. 1 and 2, a cleaning chamber 123 is connected to the rear end side of the vacuum transfer chamber 120 via a gate valve 124, for example. The cleaning chamber 123 is configured to accommodate the wafer transfer module 20. The wafer transfer module 20 in which reaction products and the like adhere to the stage 21 due to the processing of the wafer W is moved into the cleaning chamber 123, and a cleaning gas is supplied toward the stage 21. As a result, cleaning is performed to remove the reaction products. Instead of the cleaning chamber 123, a wafer transfer module exchange chamber in which a plurality of either or both of the wafer transfer modules 20 or stages 21 are stocked, or a stage exchange chamber may be connected to the vacuum transfer chamber 120.

Further, inside the vacuum transfer chamber 120, a closing module 50 is provided for closing the opening 111 of the wafer processing chamber 110 while the wafer W is not being processed. The closing module 50 has the same configuration as that of the wafer transfer module 20 described above, except that the stage 21 is not provided. In other words, the closing module 50 is configured to include the module-side coils 35 within the traveling plate 22, to be magnetically levitated using the repulsive force acting between it and the floor-side coils 15 of the floor 10, and to be movable within the vacuum transfer chamber 120.

The closing module 50 moves upward using the above-described raising and lowering mechanism 4, and closes the opening 111 by bringing the traveling plate 22 into contact with the ceiling surface of the vacuum transfer chamber 120 where the opening 111 of the wafer processing chamber 110 is formed. The O-ring 23 and the positioning pins 33 described above may be provided on the upper surface of the traveling plate 22.

The number of closing modules 50 disposed in the vacuum transfer chamber 120 may be less than the number of wafer processing chambers 110 provided on the upper surface side of the vacuum transfer chamber 120. When there are wafer processing chambers 110 not processing the wafers W due to the processing schedule of the wafers W, a sufficient number of closing modules 50 may be disposed to keep the openings 111 of the wafer processing chambers 110 closed.

Further, as shown in FIG. 1, for example, a retract chamber 121 for retracting the closing module 50 while the closing module 50 is not used may be connected to the rear end side of the vacuum transfer chamber 120. The configuration of the retract chamber 121 is not particularly limited as long as it has a space for accommodating the closing module 50 that has been retracted. Further, the inner spaces of the closing module 50 and the vacuum transfer chamber 120 may always be in a state of communication, and it is not an essential requirement to be able to separate the two inner spaces using a gate valve or the like.

Next, a mechanism for transferring the wafer W to and from the load-lock chamber 130 will be described with reference to FIGS. 2 and 5. For example, a wafer transfer mechanism 160 for transferring the wafer W between the stage 131 in the load-lock chamber 130 and the stage 21 on the wafer transfer module 20 side is provided at the ceiling portion of the load-lock chamber 130.

As shown in FIG. 2, the wafer transfer mechanism 160 of this example includes an arm portion 162 which is configured be rotatable about the central axis, vertically movable, and telescopic, and an end effector 163 provided at a tip side of the arm portion 162. A Bernoulli chuck 161 capable of lifting and transferring the wafer W in a non-contact state is provided on the lower surface of the end effector 163.

Alternatively, the end effector 163 may be provided with an edge clamp (not shown) instead of the Bernoulli chuck 161, and the wafer W may be transferred while being sandwiched and held by contacting the side surface of the wafer W with the edge clamp. The wafer transfer mechanism 160 corresponds to a substrate transfer mechanism provided outside the vacuum transfer chamber 120.

Figure 5:
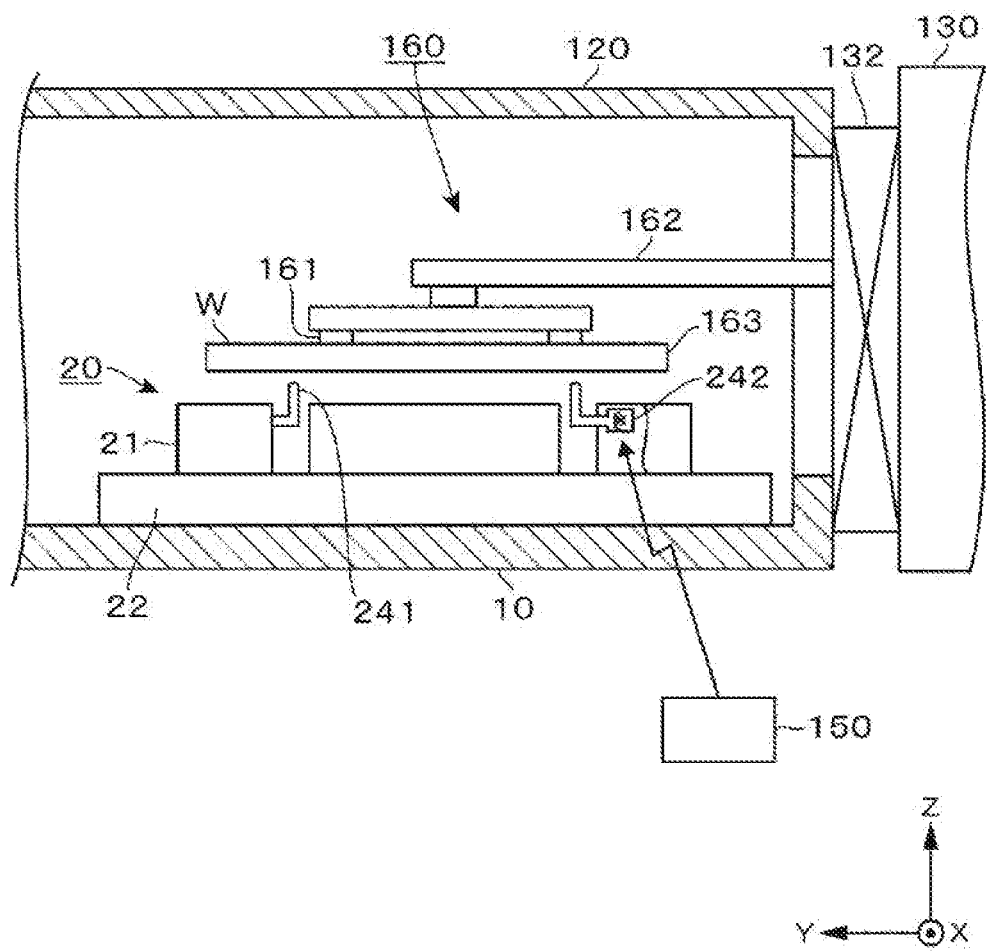
FIG. 5 an enlarged longitudinal side view of the vacuum transfer chamber.

On the other hand, as shown in FIG. 5, the stage 21 of the wafer transfer module 20 is provided with a plurality of lifting pins 241 configured to freely protrude from and retract below the upper surface of the stage 21, which is the placing surface, in order to transfer the wafer W to and from the wafer transfer mechanism 160. In the stage 21, a raising and lowering mechanism for raising and lowering the lifting pins 241 is provided in order to perform the protruding and retracting operation.

The raising and lowering mechanism of the lifting pins 241 includes a lifting coil 242 which is a third magnet that exerts a repulsive force with the magnetic field generated by the floor-side coils 15 provided in the floor 10. By changing the levitation amount of the magnetic levitation using the repulsive force, the lifting pins 241 are raised and lowered. By this operation, the lifting pins 241 protrude from and retract below the stage 21, and the wafer W is transferred to and from the wafer transfer mechanism 160. The stage 21 is provided with a battery (not shown) that supplies power to the lifting coil 242 and a power supply controller that controls the power supply, as in the case of the module-side coils 35 described above.

The method for realizing the raising and lowering operation of the lifting pins 241 is not limited to the use of magnetic levitation. For example, a mechanical raising and lowering mechanism may be provided in the stage 21 to raise and lower the lifting pins 241 using a motor or the like.

The wafer processing apparatus 100 configured as described above includes the controller 150 that controls the floor-side coils 15, the raising and lowering mechanism 4, the wafer processing chamber 110, and the like. The controller 150 is configured by a computer having a CPU and a storage device, and controls each component of the floor 10 and the like. The storage device stores a program including a group of steps (instructions) for controlling the operation of the wafer transfer module 20 and the wafer processing chamber 110. The program is stored in a storage medium such as a hard disk, a compact disk, a magnetic optical disk, a memory card, or the like, and is installed in the computer form the storage medium.

Next, an example of the operation of the wafer processing apparatus 100 will be described. First, when the carrier C accommodating the wafer W to be processed is placed on the load port 141, the wafer W is taken out from the carrier C by the wafer transfer mechanism (not shown) in the atmospheric transfer chamber 140. Next, when the gate valve 133 is opened, the wafer transfer mechanism enters the load-lock chamber 130 and places the wafer W on the stage 131. After that, when the wafer transfer mechanism is withdrawn from the load-lock chamber 130, the gate valve 133 is closed, and the inner atmosphere of the load-lock chamber 130 is switched from the atmospheric pressure atmosphere to the vacuum atmosphere.

When the inner atmosphere of the load-lock chamber 130 becomes the vacuum atmosphere, the gate valve 132 is opened and the wafer W is transferred into the vacuum transfer chamber 120 by the wafer transfer mechanism 160. In the vacuum transfer chamber 120, one wafer transfer module 20 stands by near the position where the load-lock chamber 130 is connected. Then, the lifting pins 241 are raised by magnetic levitation using the magnetic field generated by the floor-side coils 15 provided in the floor 10. At this time, the module-side coils 35 are turned off so as not to be affected by the magnetic field generated for performing the raising and lowering operation of the lifting pins 241. Therefore, the wafer transfer module 20 is placed on the upper surface of the floor 10 of the vacuum transfer chamber 120.

By the above-described operation, the tip of the lifting pins 241 protrudes above the surface on which the wafer W is placed, and the wafer W is transferred from the wafer transfer mechanism 160 to the lifting pins 241. Thereafter, the lifting pins 241 are lowered and the wafer W is transferred from the lifting pins 241 to the stage 21, whereby the wafer W is placed on a predetermined placing surface. When the wafer transfer mechanism 160 is withdrawn from the vacuum transfer chamber 120, the gate valve 132 is closed.

In the case of adopting a method for lifting the wafer W by bringing the Bernoulli chuck 161 close to the upper surface of the wafer W, it is not essential to transfer the wafer W via the lifting pins 241. The wafer W may be transferred directly between the wafer transfer mechanism 160 and the placing surface of the stage 21.

When the wafer W is transferred to the wafer transfer module 20, the module-side coils 35 provided in the wafer transfer module 20 are turned on, and the wafer transfer module 20 is moved toward the wafer processing chamber 110 where the wafer W is processed by magnetic levitation.

When the wafer W is processed after the processing of another wafer W in the wafer processing chamber 110 to which the wafer W is transferred, the support plate 41 of the raising and lowering mechanism 4 is lowered, and another wafer transfer module 20 that has been used for processing the preceding wafer W is removed from the wafer processing chamber 110. Another wafer transfer module 20 transfers the processed wafer W to the transfer position with the load-lock chamber 130.

When the wafer processing chamber 110 to which the wafer W is transferred is in a standby state in which the preceding wafer W is not processed, the support plate 41 is lowered and the closing module 50 is removed from the wafer processing chamber 110. The closing module 50 moves to the retract chamber 121.

By these operations, the wafer transfer module 20 and the closing module 50 blocking the opening 111 are removed, and a new wafer W can be loaded into the wafer processing chamber 110.

On the other hand, the wafer transfer module 20 that has received the new wafer W moves from the position where the wafer W is received from the load-lock chamber 130 to the lower side of the wafer processing chamber 110 where the wafer W is processed. After that, the wafer transfer module 20 stops at a predetermined position on the support plate 41, and after the orientation thereof is adjusted, the module-side coils 35 are turned off. As a result, the state of magnetic levitation is released, and the wafer transfer module 20 is placed on the support plate 41.

Thereafter, the wafer W is loaded into the wafer processing chamber 110 by raising the support plate 41 and inserting the stage 21 into the wafer processing chamber 110 as shown in FIG. 6. By this operation, the opening 111 of the wafer processing chamber 110 is closed by the traveling plate 22, thereby forming an airtight processing space in the wafer processing chamber 110 (see FIG. 7).

When the loading of the wafer W is completed, the stage 21 heats the wafer W to a preset temperature, and a processing gas is supplied from the processing gas supply 112 into the wafer processing chamber 110. Thus, desired processing is performed on the wafer W.

After the wafer W is processed for a preset period of time, the heating of the wafer W is stopped and the supply of the processing gas is stopped. The wafer W may be cooled by supplying a cooling gas into the wafer processing chamber 110 as necessary. After that, the support plate 41 is lowered, and the wafer W is unloaded from the wafer processing chamber 110.

After the wafer W is unloaded, another wafer transfer module 20 may be used to load a next wafer W into the wafer processing chamber 110 for processing. Alternatively, the closing module 50 may be used to close the opening 111 for a standby state. During the standby state, the inside of the wafer processing chamber 110 may be cleaned.

On the other hand, when the support plate 41 is lowered to the floor 10 side, the wafer transfer module 20 turns on the module-side coils 35 and moves by magnetic levitation to the position where the wafer W is transferred to the load-lock chamber 130. After that, the processed wafer W is transferred to the load-lock chamber 130 and the atmospheric transfer chamber 140 in the reverse order of the loading operation, and then loaded into the carrier C for accommodating the processed wafer W.

After the processed wafer W is transferred to the load-lock chamber 130, the wafer transfer module 20 moves to the cleaning chamber 123 after each wafer W is processed or after the wafer W is processed a predetermined number of times. Cleaning is performed in the cleaning chamber 123 to remove reaction products and the like, and the stage 21 becomes clean. The wafer transfer module 20 moves to the vacuum transfer chamber 120 and transfers the wafer W again.

According to the wafer processing apparatus 100 of the present embodiment, the wafer processing chambers 110 are provided on the upper surface side of the vacuum transfer chamber 120. Therefore, an increase in the footprint of the wafer processing apparatus 100 can be suppressed, for example, compared to the case where the wafer processing chamber 110 is connected to the side surface of the vacuum transfer chamber 120.

Further, the wafer W is transferred using magnetic levitation. Therefore, compared to the case where an extendable arm type wafer transfer mechanism is provided in the vacuum transfer chamber 120 to load and unload the wafer W, it is possible to suppress an increase in the footprint and height of the vacuum transfer chamber 120 itself.

Further, the stage 21 of the present embodiment is provided in the wafer transfer module 20 that is movable by magnetic levitation. Therefore, compared to the case where the stage 21 is fixedly provided in the wafer processing chamber 110, the cleaning of the stage 21 can be performed independently using the cleaning chamber 123. As a result, the stage 21 that is in direct contact with the wafer W can be kept clean at all times, and contamination of the wafer W due to the generation of particles or the like can be suppressed.

Figure 8:
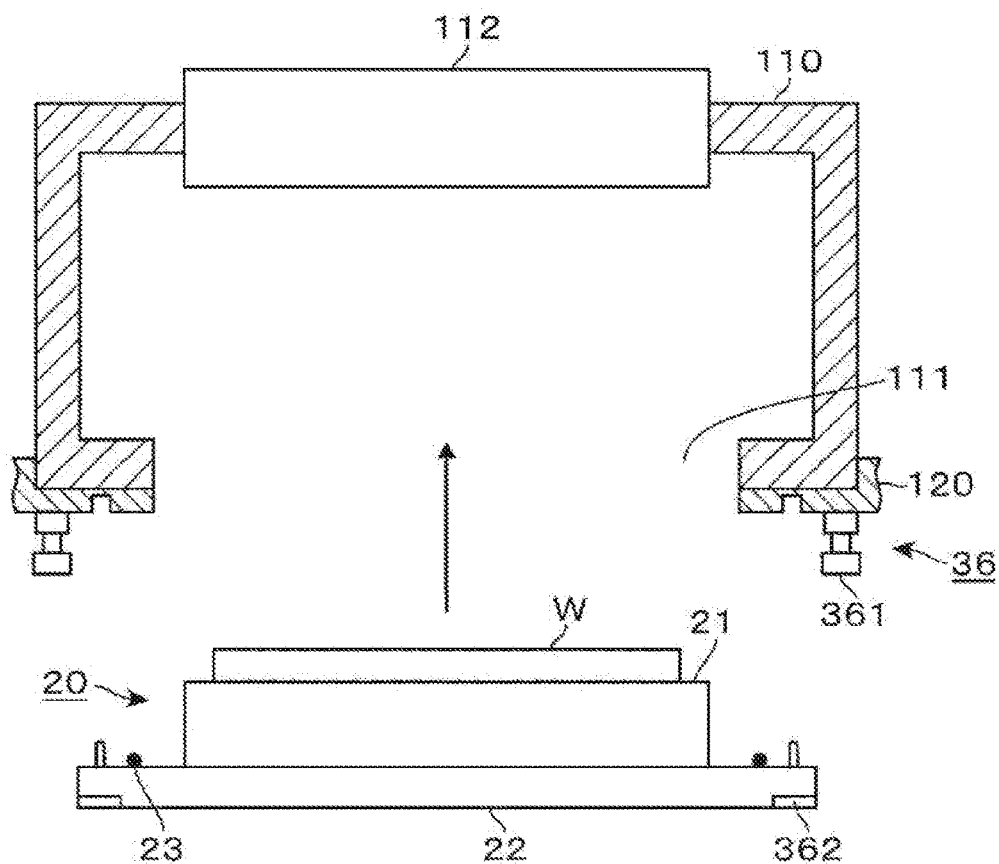
FIG. 8 a first action diagram relating to an operation of a wafer transfer module of another embodiment.

Here, the upward movement of the wafer transfer module 20 when inserting the stage 21 into the wafer processing chamber 110 is not limited to the example using the raising and lowering mechanism 4 as described above. For example, as shown in FIG. 8, the wafer transfer module 20 may be moved upward by increasing the levitation amount of magnetic levitation.

Figure 9:
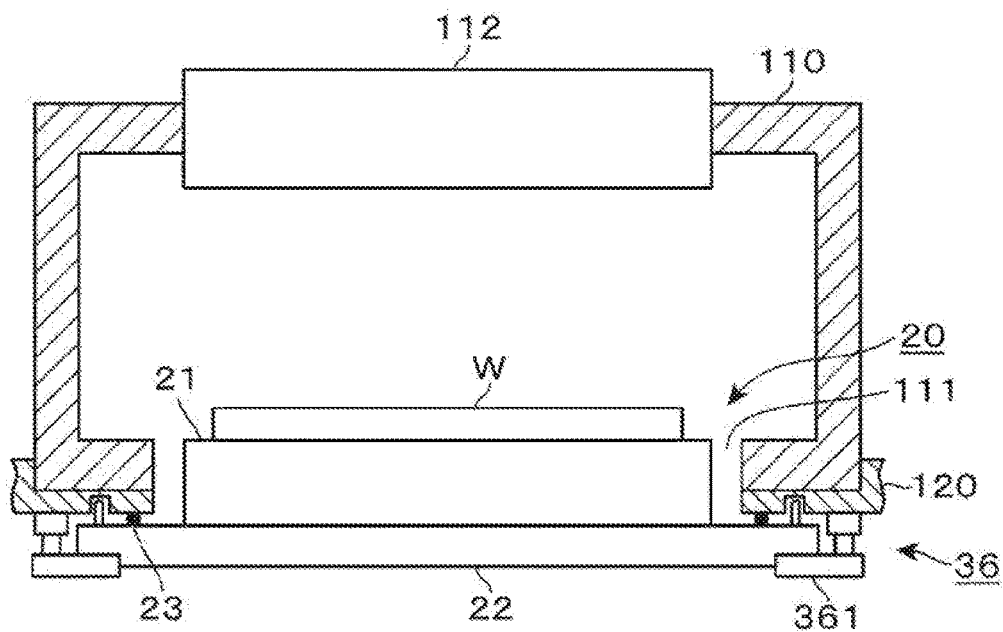
FIG. 9 a second action diagram relating to the operation of the wafer transfer module of another embodiment.

At this time, as described above, after the stage 21 is inserted into the wafer processing chamber 110, the module-side coils 35 in the wafer transfer module 20 are turned off in order to avoid the influence of the magnetic field of the floor-side coils 15. On the other hand, if the module-side coils 35 are turned off while the wafer transfer module 20 is being moved upward by magnetic levitation, the wafer transfer module 20 falls. Therefore, as shown in FIGS. 8 and 9, a support mechanism 36 may be provided on the ceiling surface of the vacuum transfer chamber 120 to support the wafer transfer module 20.

The support mechanism 36 is provided with a support member 361 that is movable between a supporting position (position shown in FIG. 9) where the traveling plate 22 is supported from its lower surface side while the stage 21 is inserted into the wafer processing chamber 110 and a retracted position (position shown in FIG. 8) retracted from this supporting position. In the example shown in FIG. 9, the support member 361 enters a notch 362 formed on the lower surface of the traveling plate 22 and supports the traveling plate 22 from its lower surface side. The function of the support mechanism 36 may be provided on the wafer transfer module 20 side.

Further, in the above-described embodiment shown in FIGS. 2, 3, and the like, the wafer transfer module 20 is configured by disposing the disc-shaped traveling plate 22 having a diameter larger than that of the disc-shaped stage 21 below the stage 21.

On the other hand, for example, a wafer transfer module 20*a* may be constructed by forming the stage 21 and the traveling plate 22 as a single unit. At this time, the phrase "forming as a single unit" can be used to form the entire wafer transfer module 20*a* without distinguishing between the stage 21 and the traveling plate 22.

Figure 10:
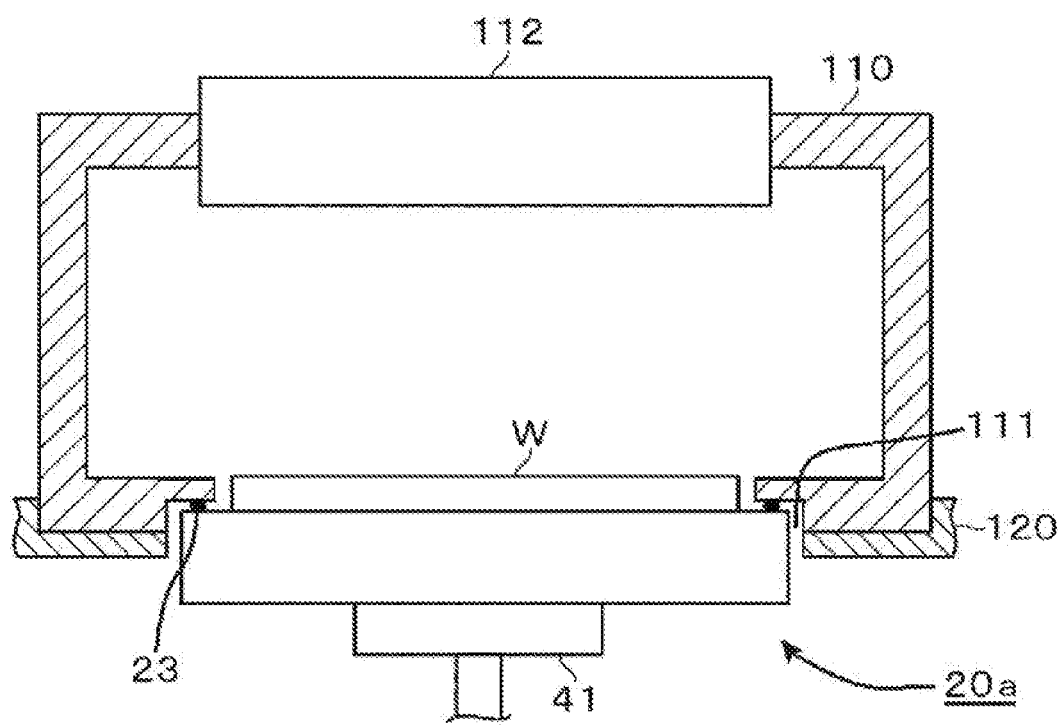
FIG. 10 an explanatory diagram relating to an integrated wafer transfer module.

In this case, as shown in FIG. 10, while the O-ring 23 is provided on the upper surface of the wafer transfer module 20*a*, a recess into which the upper portion of the wafer transfer module 20*a* can be inserted may be provided at the opening 111 on the wafer processing chamber 110 side. The inside of the wafer processing chamber 110 can be kept airtight by inserting the upper portion of the wafer transfer module 20*a* into the recess forming a part of the wafer processing chamber 110 and bringing the O-ring 23 provided on the upper surface of the wafer transfer module 20*a* into contact with the upper surface of the recess.

Further, the number of wafer processing chambers 110 disposed on the upper surface side of the vacuum transfer chamber 120 and the arrangement layout of the wafer processing chambers 110 are not limited to the example shown in FIGS. 1 to 3. The number of wafer processing chambers 110 may be increased or decreased as necessary. For example, the technique of the present disclosure also includes a case where only one wafer processing chamber 110 is provided on the upper surface of the vacuum transfer chamber 120.

Further, the arrangement of the vacuum transfer chamber 120 is not limited to the case where the long sides of the vacuum transfer chamber 120 having a rectangular planar shape are directed in the front-rear direction as shown in FIG. 1. For example, the vacuum transfer chamber 120 may be arranged such that the long sides are oriented in the left-right direction when viewed from the load port 141 side.

Further, the planar shape of the vacuum transfer chamber 120 may have various shapes depending on the shape of the area in which the wafer processing apparatus 100 is disposed. For example, the planar shape of the vacuum transfer chamber 120 may be a square, a pentagon or higher polygon, a circle, or an ellipse.

In addition, the substrate transfer chamber in which the wafer W is transferred to the wafer processing chamber 110 using the wafer transfer module 20 is not limited to the vacuum transfer chamber 120 having a vacuum atmosphere therein. The wafer transfer module 20 of the present disclosure can also be applied to a wafer processing apparatus having a structure in which the wafer processing chamber 110 is provided on the upper surface side of the substrate transfer chamber whose interior is in an atmospheric pressure atmosphere. In this case, providing the load-lock chambers 130 for the wafer processing apparatus is not an essential requirement, and the wafer W taken out from the carrier C into the atmospheric transfer chamber 140 may be directly loaded into the substrate transfer chamber.

It should be considered that the embodiments disclosed this time are illustrative in all respects and not restrictive. The embodiments described above may be omitted, replaced, or modified in various ways without departing from the scope and spirit of the appended claims.

DESCRIPTION OF REFERENCE NUMERALS

C: carrier
W: wafer
10: floor
15: floor-side coil
100: wafer processing apparatus
110: wafer processing chamber
111: opening
120: vacuum transfer chamber
20: wafer transfer module
21: stage
22: traveling plate

The invention claimed is:

1. A substrate processing apparatus comprising:
a substrate transfer chamber having a floor provided with a first magnet;
a substrate transfer module including a stage on which a substrate is placed, a traveling plate disposed below the stage, and a second magnet having a repulsive force with respect to the first magnet, the substrate transfer module being configured to be movable in the substrate transfer chamber by magnetic levitation using the repulsive force; and
a substrate processing chamber disposed on an upper surface side of the substrate transfer chamber to process the substrate, the substrate processing chamber having an opening having a size that allows at least a part of the stage on which the substrate is placed to pass therethrough, the opening being open toward the inside of the substrate transfer chamber,
wherein the substrate is processed in a state where the stage on which the substrate is placed is inserted into the substrate processing chamber through the opening by raising the substrate transfer module and the opening is closed by the traveling plate.

2. The apparatus of claim 1, wherein the substrate transfer module is raised using a raising and lowering mechanism having a support plate that supports the traveling plate from its lower surface side and is configured to be raised and lowered.

3. The apparatus of claim 1, wherein the substrate transfer module is raised by the magnetic levitation.

4. The apparatus of claim 3, further comprising: a support mechanism provided on a ceiling surface of the substrate transfer chamber, the support mechanism including a support member that is movable between a supporting position where the traveling plate is supported from its lower surface side while the stage is inserted into the substrate processing chamber and a retracted position retracted from the supporting position.

5. The apparatus of claim 1, wherein a plurality of the substrate processing chambers are provided on the upper surface side of the substrate transfer chamber, and a plurality of the substrate transfer modules used for processing the substrates in the plurality of substrate processing chambers are provided in the substrate transfer chamber.

6. The apparatus of claim 5, wherein an inner space of the substrate transfer chamber is configured to have a height that allows another substrate transfer module to move below the substrate transfer module in a state where the stage is inserted into the substrate processing chamber.

7. The apparatus of claim 5, wherein the substrate transfer chamber has therein a closing module, the closing module comprises the traveling plate and the second magnet and does not comprise the stage, the closing module is configured to be movable in the substrate transfer chamber, and the closing module is configured to close the opening by the traveling plate while the substrate is not being processed.

8. The apparatus of claim 7, wherein the substrate transfer chamber is connected to a retract chamber for retracting the closing module while the closing module is not used.

9. The apparatus of claim 1, wherein the substrate transfer module comprises a heater provided in the stage to heat the substrate, and a heating power supply configured to supply power for heating to the heater.

10. The apparatus of claim 1, wherein the second magnet is configured as an electromagnet, and the substrate transfer module includes a magnet power supply configured to supply power to the second magnet and a power supply controller configured to stop the power supplied to the second magnet while the stage is inserted into the substrate processing chamber so as not to be affected by the first magnet.

11. The apparatus of claim 1, wherein a cleaning chamber for cleaning the stage of the substrate transfer module is connected to the substrate transfer chamber.

12. The apparatus of claim 1, wherein an exchange chamber configured to exchange the substrate transfer module and/or the stage is connected to the substrate transfer chamber.

13. The apparatus of claim 1, wherein the substrate transfer module comprises a plurality of lifting pins configured to protrude from and retract below a surface of the stage on which the substrate is placed in order to transfer the substrate to and from an external substrate transfer mechanism configured to load/unload the substrate into/from the substrate transfer chamber.

14. The apparatus of claim 13, wherein the lifting pin comprises a third magnet having a repulsive force with respect to the first magnet, and is configured to be raised and lowered by magnetic levitation using the repulsive force.

15. The apparatus of claim 1, wherein the substrate is transferred under a vacuum atmosphere in the substrate transfer chamber, and the substrate is processed under a vacuum atmosphere in the substrate processing chamber, and
a load-lock chambers whose inner atmosphere is switched between a normal pressure atmosphere and a vacuum atmosphere is connected to the substrate transfer chamber, and the substrate is loaded/unloaded through the load-lock chamber.

16. A substrate processing apparatus comprising:
a substrate transfer chamber having a floor provided with a first magnet therein;
a substrate transfer module comprising a placing surface on which a substrate is placed and a second magnet having a repulsive force with respect to the first magnet, the substrate transfer module being configured to be movable in the substrate transfer chamber by magnetic levitation using the repulsive force; and
a substrate processing chamber disposed on an upper surface side of the substrate transfer chamber to process the substrate and having an opening having a size that allows at least a part of the substrate transfer module on which the substrate is placed to pass therethrough, the opening being open toward the inside of the substrate transfer chamber, wherein the substrate is processed in a state where the opening is closed while the substrate transfer module on which the substrate is placed is inserted into the substrate processing chamber through the opening by raising the substrate transfer module, and wherein the substrate transfer module is placed on the upper surface side of the substrate transfer chamber.

17. A substrate processing method comprising, transferring a substrate placed on a stage using a substrate transfer module accommodated in a substrate transfer chamber having a floor provided with a first magnet, the substrate transfer module comprising the stage on which the substrate is placed, a traveling plate disposed below the stage, and a second magnet having a repulsive force with respect to the first magnet, and the substrate transfer module being configured to be movable in the substrate transfer chamber by magnetic levitation using the repulsive force;

subsequently inserting the stage on which the substrate is placed into a substrate processing chamber through an opening by raising the substrate transfer module toward the substrate processing chamber, the substrate processing chamber provided on an upper surface side of the substrate transfer chamber to process the substrate, the substrate processing chamber including the opening that opens toward the inside of the substrate transfer chamber, and closing the opening by the traveling plate; and subsequently processing the substrate in the substrate processing chamber.

* * * * *